United States Patent [19]

Beilstein, Jr. et al.

[11] Patent Number: 5,096,849

[45] Date of Patent: Mar. 17, 1992

[54] PROCESS FOR POSITIONING A MASK WITHIN A CONCAVE SEMICONDUCTOR STRUCTURE

[75] Inventors: Kenneth E. Beilstein, Jr., Essex; Claude L. Bertin, South Burlington; Francis R. White, Essex, all of Vt.

[73] Assignee: International Business Machines Corporation, Armonk, N.Y.

[21] Appl. No.: 693,136

[22] Filed: Apr. 29, 1991

[51] Int. Cl.⁵ .......................................... H01L 21/76
[52] U.S. Cl. .................................. 437/67; 437/229; 437/225; 437/228; 148/DIG. 106; 148/DIG. 50
[58] Field of Search ...................... 437/67, 68, 78, 80, 437/61, 235, 238, 225, 67; 148/DIG. 102, DIG. 106, DIG. 103, DIG. 50; 156/653

[56] References Cited

U.S. PATENT DOCUMENTS

| | | |
|---|---|---|
| 3,297,465 | 1/1967 | Connell et al. . |
| 3,342,754 | 9/1967 | Gorham . |
| 3,392,051 | 7/1968 | Caswell et al. . |
| 3,399,124 | 8/1968 | Gilch . |
| 3,607,365 | 9/1971 | Lindlof . |
| 3,900,600 | 8/1975 | Spaulding . |
| 4,303,933 | 12/1981 | Horng et al. . |
| 4,534,824 | 8/1985 | Chen . |
| 4,549,927 | 10/1985 | Goth et al. ............ 156/653 |
| 4,711,017 | 12/1987 | Lammert . |
| 4,830,978 | 5/1989 | Teng et al. .............. 437/52 |
| 4,838,991 | 6/1989 | Cote et al. . |
| 4,847,214 | 7/1989 | Robb et al. ............. 437/67 |
| 4,945,069 | 7/1990 | Carter ................. 437/67 |
| 4,984,048 | 1/1991 | Sagara et al. . |

FOREIGN PATENT DOCUMENTS 0282836 10/1989 Japan ..................... 437/67

OTHER PUBLICATIONS

Berger et al., "Method of Producing Transistors with Optimum Base Contact", IBM Technical Disclosure Bulletin, vol. 23, No. 4, Sep. 1980, pp. 1487-1488.
"A Method of Sidewall Image Transfer Utilizing the Polyimide-Nitride Material Interaction", Research Disclosure, 28622, Feb. 1988, No. 286, Kenneth Mason Publications Ltd., England.

Primary Examiner—Brian E. Hearn
Assistant Examiner—Michael Trinh
Attorney, Agent, or Firm—Perman & Green

[57] ABSTRACT

A method is described for selectively masking sidewall regions of a concave surface formed in a semiconductor body, the method comprising the steps of: forming a conformal layer of masking material on a sidewall of the concave structure; emplacing in the concave structure, a selectively removable material that partially fills the concave structure, an upper surface of the material determining the edge of a region of the concave structure to be masked; removing a portion of the conformal layer above the upper surface of the selectively removable material; and removing the selectively removable material to leave a region of remaining conformal material as a mask.

10 Claims, 3 Drawing Sheets

PROCESS FOR POSITIONING A MASK WITHIN A CONCAVE SEMICONDUCTOR STRUCTURE

FIELD OF THE INVENTION

This invention relates to semiconductor processing, and more particularly, to a method for applying mask structures in concave areas of a semiconductor substrate.

BACKGROUND OF THE INVENTION

There is a seemingly ever-increasing demand for higher levels of integration of semiconductor circuits. Sub-micron images, now being conventionally employed in semiconductor structures, rely upon state-of-the-art photolithographic processes and tooling. More exotic exposure systems, i.e., X-ray, E-beam, etc., are being utilized to obtain even smaller feature sizes. To further increase the density of semiconductor structures, the prior art has integrated devices within the depths of the substrate, in addition to its planar upper surface. Dynamic random access memories, today, commonly employ "trenches" for memory cell capacitances. In addition, slots or trenches are used to isolate individual devices within a monolithic circuit.

To improve monolithic densities, it has been proposed that active semiconductor structures be emplaced within slots/trenches in a substrate. Standard photolithographic techniques are not directly applicable to "personalization" of such concave surface areas. Other methods have been used to accomplish some level of device masking in concave substrate areas. In U.S. Pat. No. 4,303,933 to Horng et al., the fact that a grown oxide's thickness is dependent upon the level of doping of an underlying silicon layer is employed to enable a trench sidewall opening to be produced. Horng et al. show that a low temperature oxidation results in the formation of a thick oxide over a heavily doped N+ region and a thinner oxide over a lightly doped N+ region. When the oxides are subsequently etched, the thinner region is removed first, thereby opening a sidewall area for subsequent processing. A similar teaching appears in an article entitled "Method of Producing Transistors With Optimum Base Contact", by Berger et al., IBM Technical Disclosure Bulletin, Vol. 23, No. 4, Sept. 1980, pp. 1487, 1488.

In U.S. Pat. No. 4,534,824 to Chen, in-trench masking is disclosed in combination with angled implantation to form an in-trench structure. A in-trench mask is shown in U.S. Pat. No. 4,984,048 to Sagara et al., however details are not provided as to how the mask is achieved. Lammert, in U.S. Pat. No. 4,711,017, discloses a method of providing a device within a trench wherein an N+ region is formed at the bottom of the trench and subsequently driven into the substrate. The trench is then further etched to enable the addition of further internal features.

In publication 28622, entitled "A Method of Sidewall Image Transfer Utilizing the Polyimide-Nitride Material Interaction", Research Disclosure, February, 1988, No. 286, Mason Publications Ltd., England, a polyimide is used to form defined vertical sidewalls for the fabrication of spacers. No patterning of the polyimide, or nitride layers emplaced thereover, is described.

Conformal organic layers have been employed to aid in the creation of vertical semiconductor structures. One such organic material is poly-p-xylene or "parylene" which is the generic name for members of a polymer series produced by the Union Carbide Corporation. Such a use of Parylene is disclosed in U.S. Pat. No. 4,838,991 to Cote et al. More general prior art teachings relating to conformal polymeric coatings and paraxylylene can be found in the following U.S. Pat. Nos.: 3,900,600 to Spaulding, 3,297,465 to Connell et al., 3,607,365 to Lindlof, 3,392,051 to Caswell et al., 3,399,124 to Gilch, and 3,342,754 to Gorham.

In summary, the prior art shows various materials that can be employed to form and coat concave trench-like structures in semiconductor substrates. It further shows that patterns can be produced in such trench areas, and teaches that such patterns can be produced if the underlying semiconductor materials are appropriately processed (e.g., to enable different oxide rates of growth). It is highly desirable that any process used to "personalize" a trench structure be independent of the underlying semiconductor structure, insofar as the processing steps are concerned.

Accordingly, it is an object of this invention to provide an improved method for providing a mask structure within a concave semiconductor structure.

It is another object of this invention to provide an improved masking process for concave semiconductor structures wherein the process is substantially independent of underlying semiconductor compositions.

It is still another object of this invention to provide an improved masking technique for trench-like structures in a semiconductor wafer, wherein trench sidewalls can be selectively masked and subsequently processed for the incorporation of device structures therein.

SUMMARY OF THE INVENTION

A method is described for selectively masking sidewall regions of a concave surface formed in a semiconductor body, the method comprising the steps of: forming a conformal layer of masking material on a sidewall of the concave structure; emplacing in the concave structure, a selectively removable material that partially fills the concave structure, an upper surface of the material determining the edge of a region of the concave structure to be masked; removing a portion of the conformal layer above the upper surface of the selectively removable material; and removing the selectively removable material to leave a region of remaining conformal material as a mask.

DETAILED DESCRIPTION OF THE INVENTION

Figure 1:
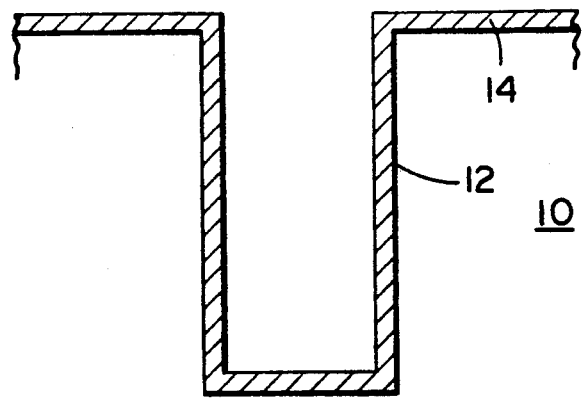
FIG. 1 shows a section of a semiconductor substrate with a trench that has an oxide or other insulating coating conforming thereto.

Prior to considering the method of the invention, the materials employed during the method will be addressed. The invention makes use of two polymeric materials that are not soluble in the same solvent. The first material is an organic that is sufficiently fluid and exhibits a low enough viscosity to fill a semiconductor's trench structure. Photoresist materials are preferred for this application. Thus, the choice of the organic material will, among other requirements, depend upon (1) its viscosity (2) the dimension of the trench or other concave structure to be processed, and (3) the relative solubility of the material in solvents. Assuming that the process will be applied to trench structures in the range of one to fifteen microns, organics such as those containing meta-cresol Novolak resins are preferred. These resins are used as a constituent in photoresists such as, KTI 895I, available from KTI Inc., 2 Barnes Industrial Park Road, Wallingford, Connecticut 06492; and IBM TNS 4207, available from the International Business Machines Corp., Old Orchard Road, Armonk, New York. These resists have viscosities less than 20 centistokes at 25° C.

The second material employed by the invention is a polymer which must be able to be deposited conformally within the trench structure. Parylene or any organic from that family is a suitable conformal coating material. To deposit a parylene coating, the substrate is exposed to a monomer comprising p-xylylene or a derivative thereof. The vapor is produced by paralytic cleavage and produces divalent p-xylylene radicals which condense and polymerize on exposed areas of the semiconductor substrate to form a homogeneous conformal coating. Pyrolysis of the coating is generally carried out at a temperature greater than 300° C. for a time which is sufficient to form a coating of the desired thickness. The preferred coating has a thickness ranging from about 50–4000 Angstroms and is prepared by employing a temperature from about 600° to about 850° C., at a pressure of about 30–1000 millitorr, for a time from about 0.5 to 45 minutes. More preferably, the coating has a thickness ranging from about 1000–3000 Angstroms with a time ranging 7–30 minutes.

Poly-p-xylyene polymers can be produced in conventional apparatus, e.g., a deposition chamber in communication with a vaporization/pyrolysis furnace. Such apparatus is shown in, for example, "Some Mechanical And Electrical Properties of Polyfluoro-p-xylylene Films Prepared by Vapor Deposition", Journal of Applied Polymer Science, Vol 40, 1795–1800 (1990).

Both the conformal coating and the photoresist should be etchable by reactive ion etching processes. The chemistry used for such etching should not etch common semiconductor materials such as silicon, $SiO_2$, $Si_3N_4$ etc. As is known, many organic photoresists fill this requirement as they can be etched in oxygen plasmas. In addition, many such photoresist materials are soluble in certain solvents which do not affect parylene or parylene-type polymers. These features are important to the success of this invention.

Referring now to FIG. 1, a section of a semiconductor substrate 10 is shown which has had a large aspect ratio trench 12 formed therein. Trench 12 can be formed using any suitable semiconductor processing technique, e.g., etching. A film 14 has been deposited (or grown) on the surface of substrate 10 and within trench 12. Film 14 is, as will be hereinafter understood, to be patterned in accordance with a mask pattern. Film 14 may be a nitride, an oxide of silicon, polysilicon, etc.

Figure 2:
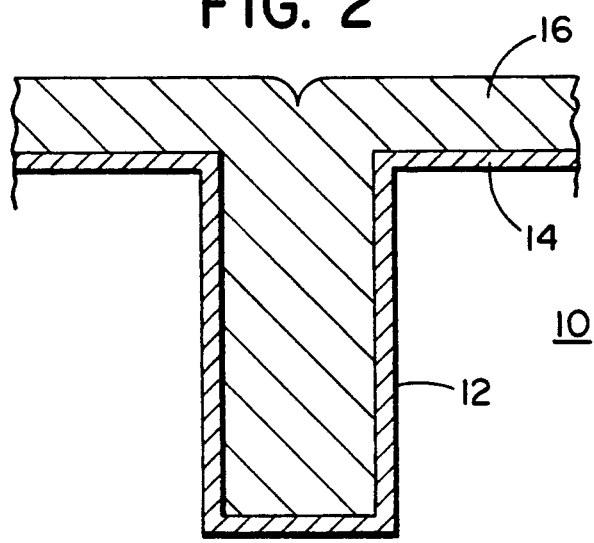
FIG. 2 shows the trench of FIG. 1 after a photoresist has been emplaced therein.
Figure 3:
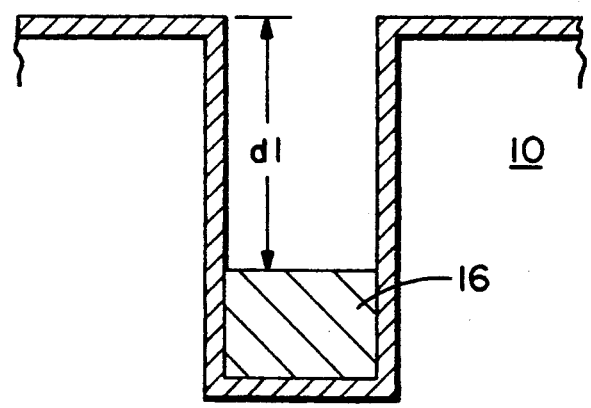
FIG. 3 shows the trench of FIG. 2 after a portion of the photoresist has been removed.

In FIG. 2, a photoresist 16 has been deposited on the upper surface of substrate 10, filling trench 12. In FIG. 3, photoresist 16 has been subjected to a reactive ion etch step and has been removed to a predetermined depth d1. Depth d1 determines where the bottom edge of a sidewall mask will be placed. A reaction ion etch is the preferred method for the removal of photoresist 16.

Figure 4:
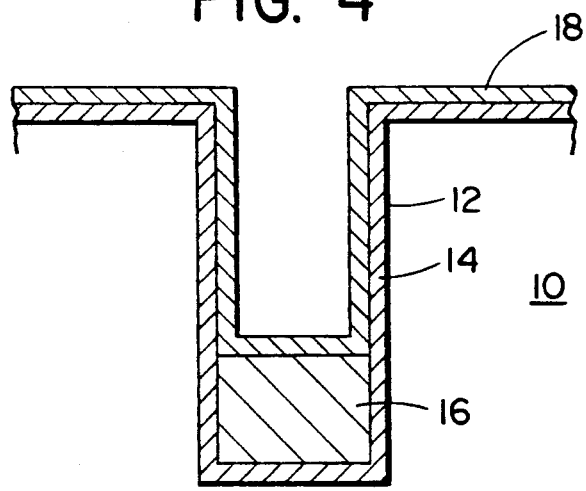
FIG. 4 shows the trench of FIG. 3 after a conformal polymeric layer has been emplaced therein.

Turning now to FIG. 4, a conformal layer 18 of an organic material is deposited over the surface of substrate 10 and within trench 12. Conformal coating 18 is preferably parylene and has been deposited as above-described. The thickness of the coating is preferably approximately 1000 Angstroms and is conformal to the exposed surface areas of substrate 10. Layer 18, after personalization, will be the masking material for whatever delineations are required on the sidewalls of trench 12.

Figure 5:
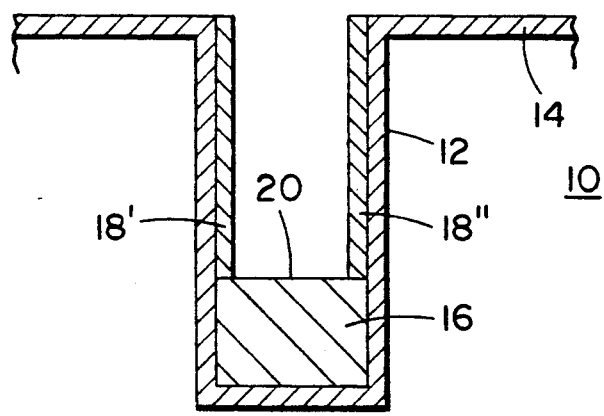
FIG. 5 shows the trench of FIG. 4 after the conformal polymeric layer has been selectively etched.

In FIG. 5, the structure shown in FIG. 4 has been subjected to a reactive ion etch to remove the horizontal aspects of conformal coating 18, leaving portions 18' and 18" adherent to the sidewalls of trench 12. Note that this process exposes the uppermost surface 20 of photoresist 16 in the bottom of trench 12.

Figure 6:
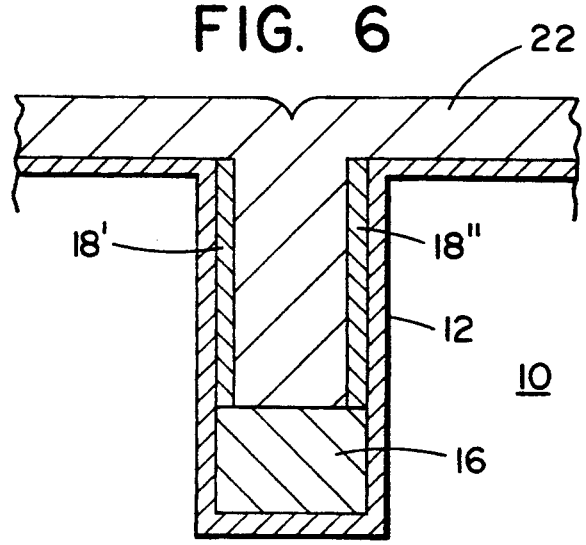
FIG. 6 shows the trench of FIG. 5 after a photoresist has been emplaced therein.
Figure 7:
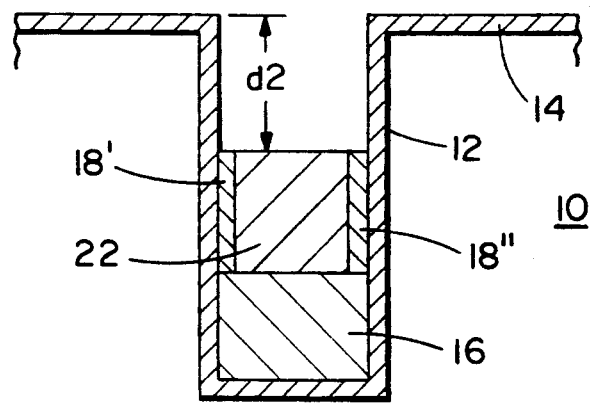
FIG. 7 shows the trench of FIG. 6 after a portion of the photoresist and conforming polymeric layer have been selectively etched.

In FIG. 6, a further layer of photoresist 22 is laid down on the surface of substrate 10, again filling trench 12. Preferably, photoresist 22 and photoresist 16 are the same material. In FIG. 7, the upper edge of the mask is defined. Photoresist 22 and conformal coatings 18' and 18" are both etched by a reactive ion etch step. This etch is similar to the two previous etches, the results of which are illustrated in FIGS. 3 and 5. The depth d2 to which conformal coatings 18', 18" and photoresist 22 are removed, determines the top edge of the sidewall mask.

Figure 8:
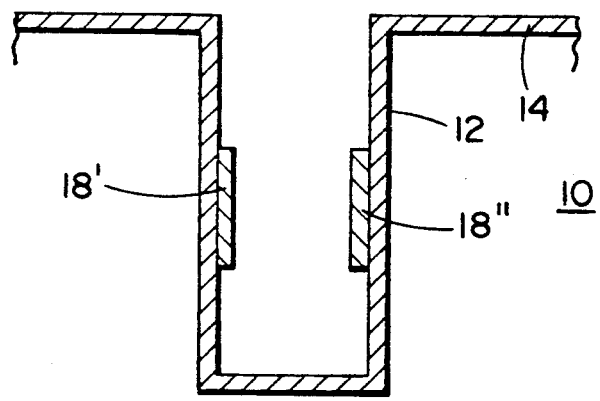
FIG. 8 shows the trench of FIG. 7 after the photoresist has been dissolved leaving areas of the conforming polymeric layer as a mask.

In FIG. 8, a solvent has been applied to the structure of FIG. 7, removing photoresist materials 16 and 22 and leaving coating regions 18' and 18" over film 14. Then, by subsequently applying an etch procedure which is selective for the material of coating 14, but not masking polymers 18, and 18", the unmasked areas of film 14 can be removed. A further selective etch then removes masking polymers 18' and 18", leaving coating portions 14, and 14" in the form of bands within trench 12.

Figure 9:
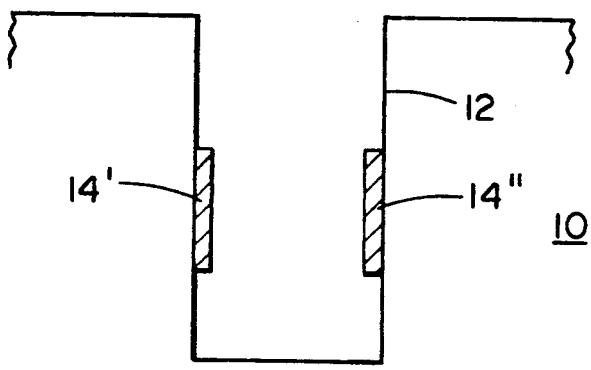
FIG. 9 shows the trench of FIG. 7 after etching of the underlying insulating layer has occurred and the masking polymeric layer has been removed.

At this point, the procedure can be repeated to produce another sidewall image higher in trench 12 than the layer just defined. In other words, the sequence of steps can be repeated a number of times to produce a plurality of bands of organic masking material 18', 18" at different heights in the trench. While merely exemplary, layers 14' and 14" in FIG. 9 may be utilized as portions of a gate structure of an FET embedded within the sidewalls of trench 12.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A method for selectively masking portions of a sidewall of a concave structure formed in a semiconductor body, the method comprising the steps of:
   a. emplacing in the concave structure, a selectively removable first material that partially fills the concave structure, an upper surface of said removable first material defining a lower edge of a sidewall region of said concave structure to be masked;
   b. forming a conformal layer of a masking material on a sidewall of the concave structure;
   c. emplacing in the concave structure, a selectively removable second material, an upper surface of the removable second material defining an upper edge of a sidewall region to be masked in the concave structure;
   d. removing a portion of said conformal layer that is above the upper surface of said selectively removable second material; and
   e. removing the selectively removable first and second materials to leave a region of remaining conformal masking material on a sidewall of said concave structure.

2. The method as defined in claim 1 wherein said concave structure comprises a trench exhibiting a substantial depth to width aspect ratio.

3. The method as defined in claim 2, wherein said step (c) causes said selectively removable second material to be emplaced on said selectively removable first material.

4. The method as recited in claim 3, wherein step (b) causes a formation of said conformal layer of masking material over all exposed surfaces in said trench, including an upper surface of said selectively removable first material.

5. The method as recited in claim 4, wherein subsequent to step (b), and prior to step (c), said conformal layer of masking material on the upper surface of said selectively removable first material is etched to expose said upper surface of said removable first material.

6. The method as recited in claim 5 wherein steps (a) and (c) each comprise the substeps of:
   filling the trench with the selectively removable material; and
   selectively etching said removable material to a desired depth in said trench.

7. The method as recited in claim 6 wherein step (d) also accomplishes the removal of a portion of said selectively removable second material.

8. The method as recited in claim 7, wherein said selectively removable materials are identical in composition.

9. The method as recited in claim 8, wherein said conformal layer of masking material is a poly-p-xylylene.

10. The method as recited in claim 7, wherein said selectively removable materials are photoresists and exhibit viscosities that enable them to completely fill the trench when emplaced therein.

* * * * *